US008108164B2

(12) United States Patent
Joublin et al.

(10) Patent No.: US 8,108,164 B2
(45) Date of Patent: Jan. 31, 2012

(54) DETERMINATION OF A COMMON FUNDAMENTAL FREQUENCY OF HARMONIC SIGNALS

(75) Inventors: Frank Joublin, Mainhausen (DE); Martin Heckmann, Frankfurt (DE)

(73) Assignee: Honda Research Institute Europe GmbH, Offenbach/Main (DE)

( * ) Notice: Subject to any disclaimer, the term of this patent is extended or adjusted under 35 U.S.C. 154(b) by 0 days.

(21) Appl. No.: 11/340,918

(22) Filed: Jan. 26, 2006

(65) Prior Publication Data

US 2006/0195500 A1 Aug. 31, 2006

(30) Foreign Application Priority Data

Jan. 28, 2005 (EP) .................................... 05001817
Feb. 24, 2005 (EP) .................................... 05004066

(51) Int. Cl.
*G01R 23/00* (2006.01)

(52) U.S. Cl. ......................................... 702/75; 704/207

(58) Field of Classification Search .................... 702/69, 702/75-76, 106, 189-191; 704/205-208
See application file for complete search history.

(56) References Cited

U.S. PATENT DOCUMENTS 3,622,706 A 11/1971 Kalfaian
3,629,510 A * 12/1971 Anderson et al. ............. 704/208
4,047,108 A 9/1977 Bijker et al.
4,091,237 A * 5/1978 Wolnowsky et al. ......... 704/207
4,640,134 A 2/1987 Simmons
4,783,805 A 11/1988 Nishio et al.
4,905,285 A 2/1990 Allen et al.
5,136,267 A 8/1992 Cabot
5,214,708 A 5/1993 McEachern
5,228,088 A * 7/1993 Kane et al. .................... 704/233
6,130,949 A 10/2000 Aoki et al.
7,076,433 B2 7/2006 Ito et al.
2002/0133333 A1 9/2002 Ito et al.
2003/0084277 A1 5/2003 Przywara et al.
2007/0083365 A1 4/2007 Shmunk

OTHER PUBLICATIONS

Elghonemy, M. et al., "An Iterative Method for Formant Extraction Using Zero-Crossing Interval Histograms," IEEE Melecon '95, vol. II: Digital Signal Processing, 1985, pp. 155-162.
European Search Report, EP 05004066, Jun. 3, 2005, 5 pages.
Gerhard, D., "Pitch Extractions and Fundamental Frequency: History and Current Techniques," Department of Computer Science, University of Regina, Nov. 2003, pp. 1-22, Regina, Saskatchewan, Canada.
Hess, W., "A Pitch-Synchronous Digital Feature Extraction System for Phonemic Recognition of Speech," IEEE Transactions on Acoustics, Speech, and Signal Processing, Feb. 1976, vol. ASSP-24, No. 1.

(Continued)

*Primary Examiner* — Manuel L Barbee
(74) *Attorney, Agent, or Firm* — Fenwick & West LLP

(57) ABSTRACT

Techniques are provided for determining the time course of the fundamental frequency of harmonic signals, wherein the input signal is split into different frequency channels by band pass filters. Distances between crossings of different orders are determined, and a histogram of all these distance values for each instant in time is calculated. The distance values build a peak at the distance corresponding to the fundamental frequency. An example application of this technique is separation of acoustic sound sources in monaural recordings based on their underlying fundamental frequency. Application of these techniques, however, is not limited to the field of acoustics. These techniques can also be applied to other signals such as those originating from pressure sensors.

16 Claims, 3 Drawing Sheets

OTHER PUBLICATIONS

Kedem, B., "Spectral Analysis and Discrimination by Zero-Crossings," Proceedings of the IEEE, Nov. 1986, vol. 74, No. 11.

Liu, Y., "A Robust 400-bps Speech Coder Against Background Noise," IEEE, 1991, pp. 601-604.

Ohmura, H., "Fine Pitch Contour Extraction by Voice Fundamental Wave Filtering Method," IEEE, 1994, pp. II-189-II-192.

Park, K-Y. et al., "An Engineering Model of the Masking for the Noise-Robust Speech Recognition," Brain Science Research and Dept. of Electrical Engineering and Computer Science, Korea Advanced Institute of Science and Technology, 2003, 16 pages.

Kaminsky, I. et al., "Automatic Source Identification of Monophonic Musical Instrument Sounds," Proceedings, IEEE International Conference on Neural Networks, Nov./Dec. 1995, pp. 189-194. vol. 1.

Vincent, E. et al., "A Tentative Topology of Audio Source Separation Tasks," in 4$^{th}$ International Symposium on Independent Component Analysis (ICA 2003), Nara, Japan, Apr. 2003, pp. 715-720.

Hu, G. et al., "On Amplitude Modulation for Monaural Speech Segregation," Proceedings of the 2002 International Joint Conference on Neural Networks, IJCNN'02, Honolulu, Hawaii, May 12-17, 2002, International Joint Conference on Neural Networks, New York, NY, IEEE, May 12, 2002, pp. 69-74, vol. 1 of 3.

* cited by examiner

DETERMINATION OF A COMMON FUNDAMENTAL FREQUENCY OF HARMONIC SIGNALS

CROSS-REFERENCE TO RELATED APPLICATIONS

This application is related to and claims priority from European Patent Applications No. 05 001 817.5 filed on Jan. 28, 2005 and 05 004 066.6 filed on Feb. 24, 2005, which are all incorporated by reference herein in their entirety. This application is related to U.S. patent application Ser. No. 11/142,879, filed on May 31, 2005, entitled "Determination of the Common Origin of Two Harmonic Signals," which is incorporated by reference herein in its entirety. This application is also related to U.S. patent application Ser. No. 11/142,095, filed on May 31, 2005, entitled "Unified Treatment of Resolved and Unresolved Harmonics," which is incorporated by reference herein in its entirety.

FIELD OF THE INVENTION

The underlying invention generally relates to the field of signal processing and in particular to techniques for determining the common fundamental frequency of harmonic signals.

BACKGOUND OF THE INVENTION

While making acoustic recordings often multiple sound sources are present simultaneously. These can be different speech signals, noise (e.g. of fans) or similar signals. Moreover, a speech signal in general contains many voiced and hence harmonic segments. For further analysis of the signals it is first necessary to separate these interfering signals. Common applications are speech recognition or acoustic scene analysis. Harmonic signals can be separated in the human auditory system based on their fundamental frequency. See A. Bregman, Auditory Scene Analysis, MIT Press, 1990, which is incorporated by reference herein in its entirety.

In conventional approaches the input signal is split into different frequency bands via band-pass filters and in a later stage for each band at each instant in time an evidence value in the range of 0 and 1 for this band to originate from a given fundamental frequency is calculated. Note that a simple unitary decision can be interpreted as using binary evidence values. By doing so a three dimensional description of the signal is obtained with the axes: fundamental frequency, frequency band, and time. Such a kind of representation is also found in the human auditory system. See G. Langner, H. Schulze, M. Sams, and P. Heil, The topographic representation of periodicity pitch in the auditory cortex, Proc. of the NATO Adv. Study Inst. on Comp. Hearing, pages 91-97, 1998, which is incorporated by reference herein in its entirety. Based on these beforehand calculated evidence values, groups of bands with common fundamental frequency can be formed. Hence in each group only the harmonics emanating from one fundamental frequency and therefore belonging to one sound source are present. By this means the separation of the sound sources can be accomplished.

A crucial step in the separation of sound sources is determining the fundamental frequencies present and assigning the different harmonics to their corresponding fundamental frequency. In conventional approaches this is done via the auto-correlation function. See G. Hu and D. Wang, Monaural speech segregation based on pitch tracking and amplitude, IEEE Trans. On Neural Networks, 2004, which is incorporated by reference herein in its entirety. For each frequency band the auto-correlation is determined and frequencies being in a harmonic relation will share peaks in the lag domain. Using this approach, a peak also occurs at the lag corresponding to the frequency of the harmonic and multiples of this lag. Accordingly, there is a need for new techniques for finding the common fundamental frequency of harmonics in a harmonic signal.

SUMMARY OF THE INVENTION

Techniques are provided to replace the auto-correlation function used conventionally by the calculation of the distances of different orders of defined crossings, for example zero crossings, of the signal. One embodiment of the invention provides techniques for finding the common fundamental frequency of the harmonics in a harmonic signal and assigning time frequency units an evidence value representing a measure to judge whether they belong to the found fundamental frequency. An example application of this technique is separation of acoustic sound sources in monaural recordings based on their underlying fundamental frequency. Application of these techniques, however, is not limited to the field of acoustics. These techniques can also be applied to other signals such as those originating from pressure sensors.

According to one embodiment, techniques are provided for determining the fundamental frequency of a harmonic signal by spitting the harmonic signal into frequency channels and determining, for at least one of the frequency channels, distances between crossings of different orders. The determined distances for an instant in time are used to calculate a histogram. Distances in a peak region of the histogram correspond to the fundamental frequency of the harmonic signal.

One skilled in the art will recognize that various points of a sinusoidal curve such as maxima, minima or intersection points with a constant value can be used as crossings. For example, zero crossings from negative to positive or from positive to negative or both can be used.

One embodiment of the invention provides a method of extracting the time course of the fundamental frequency of different harmonic signals present in an input signal. The method is based on evaluation of the distances between crossings of the sinusoidal signal, such as maxima, minima, or constant values. Example crossing with a constant value are zero crossings. By determining the distances between multiple zero crossings, one embodiment of the invention takes into account that higher order harmonics show multiple zero crossings in one period of the fundamental frequency. These distances between multiple zero crossings of higher order harmonics can be referred to as higher order zero crossings.

One embodiment of the invention provides for the weighting of these crossing distances with the energy of the underlying filter channel and with an additional weight value which depends on the order of the crossing distances.

One embodiment of the invention can be applied to find the time course of the fundamental frequency in a harmonic signal and to calculate an evidence value for each channel at each instant in time to belong to the found fundamental frequency.

Further advantages and features of the present invention will be evident to one having ordinary skill in the art based on the detailed description and drawings.

DETAILED DESCRIPTION OF THE PREFFERRED EMBODIMENTS

Figure 1:
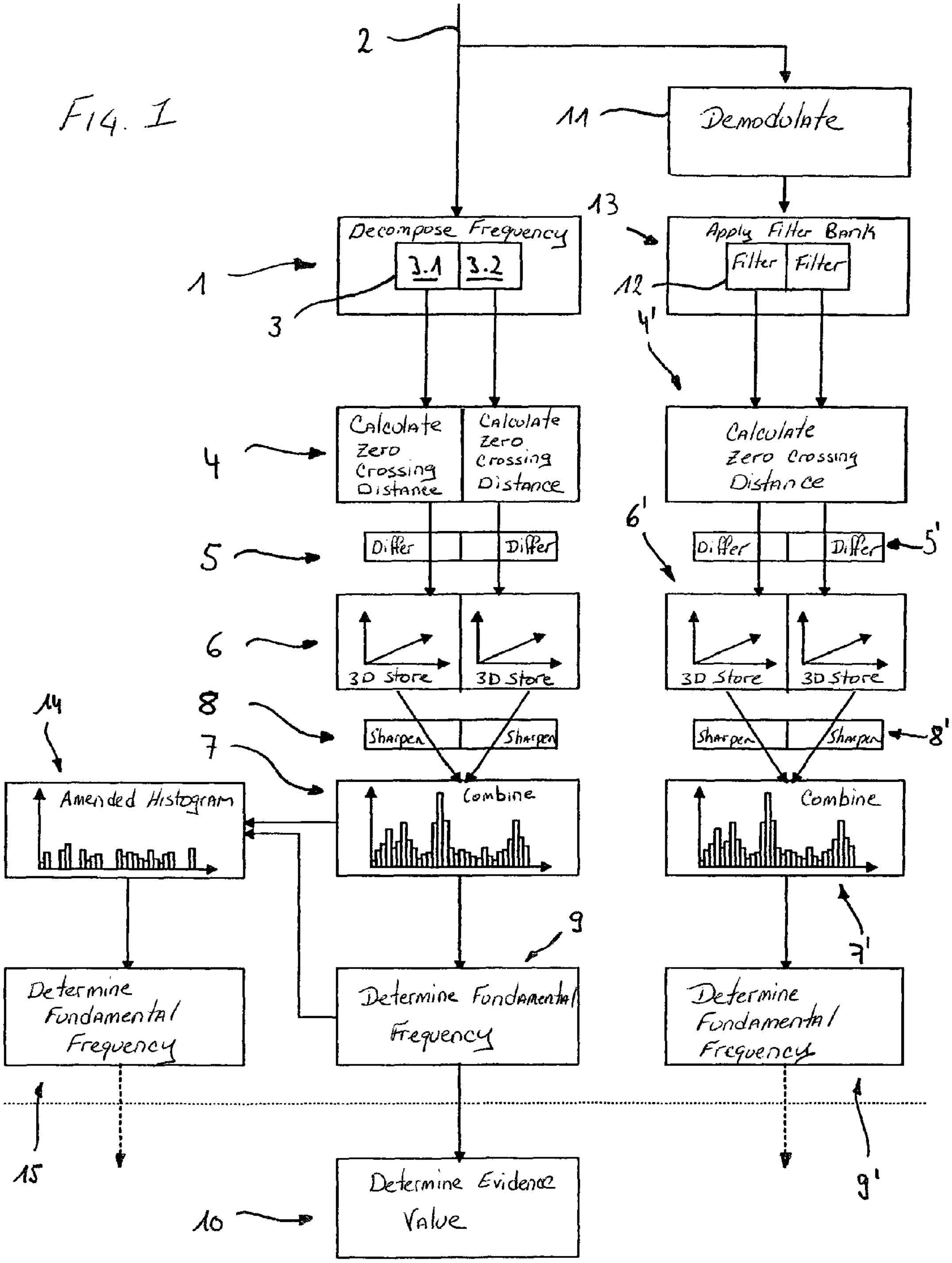
FIG. 1 shows a flow chart of a method for finding a common fundamental frequency and determining an evidence value, according to one embodiment of the present invention.

FIG. 1 shows a flowchart of a method for finding a common fundamental frequency according to one embodiment of the present invention. For purposes of illustration, the method in FIG. 1 is explained with reference to zero crossings. However, one skilled in the art will recognize that other types of crossings, such as maxima, minima or constant value crossings can be used.

The first step 1 of the method includes frequency decomposition of the input signal 2 with a filter bank 3, comprising a set of band pass filters, for example two filters 3.1, 3.2. According to one embodiment, the next step 4 of the method comprises calculation of the distance between each crossing, every three crossings, every zero crossings and so forth up to the maximum order of crossings investigated for each filter signal. For example, step 4 comprises calculation of the distance between each zero crossing, every three zero crossings, every four zero crossings and so forth up to the maximum order of zero crossings investigated for each filter signal. These distance values can be stored in a three-dimensional representation with the axes time, frequency and distance. In the case of speech signals the different harmonics may not be in phase with each other due to the influence of the vocal tract.

Accordingly to one embodiment of the present invention, in order to be independent of the actual phase relation the previously calculated distance values are not only entered in the three-dimensional representation at the point where they where calculated, which is the occurrence of the crossing, but are entered at all values beginning from the current crossing back in time to the previous crossing. For example, the calculated distance values can be entered at all values beginning from the current zero crossing back in time to the previous zero crossing. This way the signals of different filter channels according to the band pass filters 3.1 and 3.2 can be more easily combined. Therefore, according to one embodiment, in step 5 the difference between the current zero crossing and the previous zero crossing is calculated before the data is stored in the three dimensional representation (step 6).

According to one embodiment, in order to find the underlying fundamental frequency, the information of the different channels is combined in step 7. A histogram can be calculated in which at each instant in time it is entered how often a certain distance value has been found. This yields a two-dimensional representation in the time and distance domain where peaks occur at the location of the underlying fundamental frequency. This is due to the fact that the distance value of the fundamental frequency occurs at the first order zero crossing of the fundamental frequency, the second order zero crossing of the first harmonic, the third order zero crossing of the second harmonic and so forth. Therefore the distance value of the fundamental frequency occurs much more often than the other distance values and hence forms a peak in the histogram.

For the calculation of the histogram it is possible similar to a comb filter to only use filter channels which center frequencies are in a harmonic relation or close to a harmonic relation. According to one embodiment, the calculation of the harmonic relation is based on a fundamental frequency hypothesis. To build a complete histogram, according to one embodiment all possible fundamental frequency hypotheses are processed.

According to one embodiment of the present invention, in order to further sharpen the peaks in the time-distance histogram the occurrences of the corresponding distance values can be weighted with the energy of the underlying filter channel. This way distance values from channels with high energy contribute more to the histogram than those with low energy.

According to one embodiment of the present invention, an additional sharpening of the histogram can be achieved by setting different weights depending on the order of the crossings, for example depending on the order of the zero crossings. It is known from human perception that low order harmonics are more important for the perception of fundamental frequency than higher order harmonics. According to one embodiment, the method can take this into account by using larger weights for the low order zero crossings and lower weights for the higher order zero crossings. The sharpening can be performed in an optional step 8 before the histogram of step 7 is calculated.

In the calculated histogram, the time course of the fundamental frequency is represented by the peaks in the histogram. The frequency is the inverse of the found distance multiplied by the sampling rate. That way the fundamental frequency can be read out from the histogram at each instant in time. According to one embodiment of the present invention, in step 9 the fundamental frequency is calculated by first determining the maximum peak and its distance in relative time units of the sampling process and second multiplying this distance with the sampling rate.

According to one embodiment, once the fundamental frequency is found an evidence value (which can be soft information) for each filter channel belonging to this fundamental frequency can be calculated in step 10 on the basis of the minimal distance between the zero crossing distance of the fundamental frequency and the distances of all orders of the channel under investigation. The lower this distance, the higher the evidence value and thus the probability that the filter channel actually belongs to this fundamental frequency.

For higher frequencies the distances between zero crossings can be small and very high orders of zero crossings may have to be calculated to span one period of the fundamental. In order to overcome the problems related to this, the fact can be exploited that higher order harmonics corresponding to higher frequencies are usually unresolved and therefore show amplitude modulation with the fundamental frequency. According to one embodiment of the present invention, by demodulation of the input signal with the knowledge of the fundamental frequency in step 11 and application of a second filter bank 12 on a respective demodulated signal (see U.S. patent application Ser. No. 11/142,095, filed on May 31, 2005, entitled “Unified Treatment of Resolved and Unresolved Harmonics,” which is incorporated by reference herein in its entirety) in step 13 these high frequencies can be transformed into the low frequency domain. The resulting first order crossing distance, for example the resulting first order zero crossing distance, corresponds to the fundamental frequency of the unresolved harmonic. This value can now be used for the calculation of the distance-time histogram in the same way as the other crossing distances.

According to one embodiment of the present invention, in order to facilitate the extraction of the time course of the fundamental frequency from the time-distance histogram and the calculation of the evidence value as well the calculated histogram, the distance values can be smoothed by a low-pass or similar filter.

One embodiment of the method presented above produces high peaks at the distance value of the fundamental frequency but also smaller peaks at multiples and integer fractions of this distance value. These additional peaks can hamper extraction of the distances corresponding to other harmonic signals. One embodiment of a method to inhibit these interfering signals is provided in the following discussion. It can be assumed that the maximum value for each instant in time corresponds to the distance of the fundamental frequency. Therefore the maximum in the time-distance histogram is calculated for each instant in time in step 9. Next at distance values corresponding to multiples and integer fractions of the distance corresponding to the maximum which is known from step 9 and directly neighboring values the maximum value is subtracted. An amended histogram is thus calculated in step 14. According to one embodiment of the present invention, it is further possible to perform a spatial and temporal integration before the calculation of the maximum to make it less sensitive to noise. In the amended histogram resulting from this suppression process, additionally present harmonic signals can be readily identified by a calculation that is similar to the one performed in step 9. To further enhance these signals also the found maximum can be subtracted.

Figure 2:
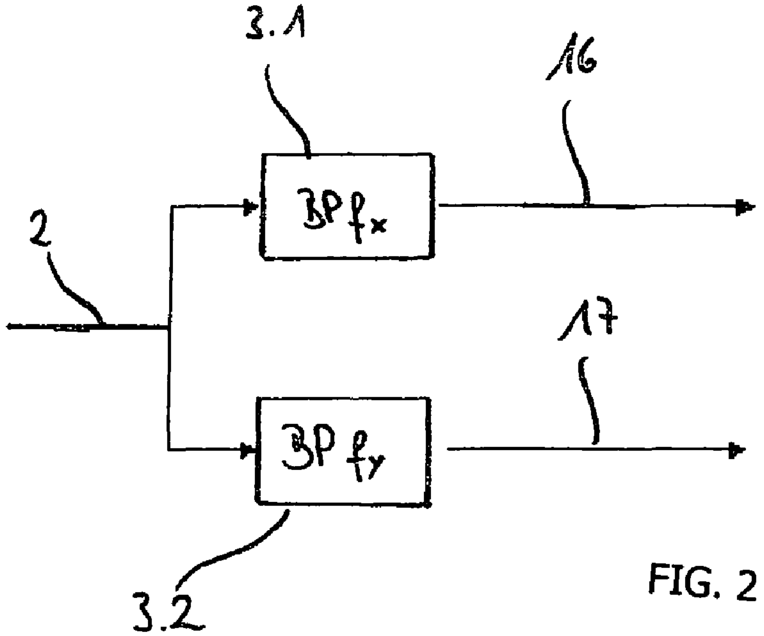
FIG. 2 shows a band-pass filtering as a first step of a signal processing according to one embodiment of the present invention.

FIG. 2 shows two frequency bands 16, 17 filtered from the input signal 2 by band-pass filters 3.1 and 3.2 having a center frequency of $f_X$ and $f_y$, wherein one embodiment of the present invention determines the fundamental frequency from these signals and calculates an evidence value that the two frequency bands 16, 17 originate from this fundamental frequency. Note that a frequency band 16, 17 can also contain the fundamental frequency. However, the actual fundamental frequency need not be present as the evidence value can also be calculated from harmonic signals, which also enables determination of the fundamental frequency in signals that do not contain the fundamental frequency as can be the case for some speech signals.

Figure 3:
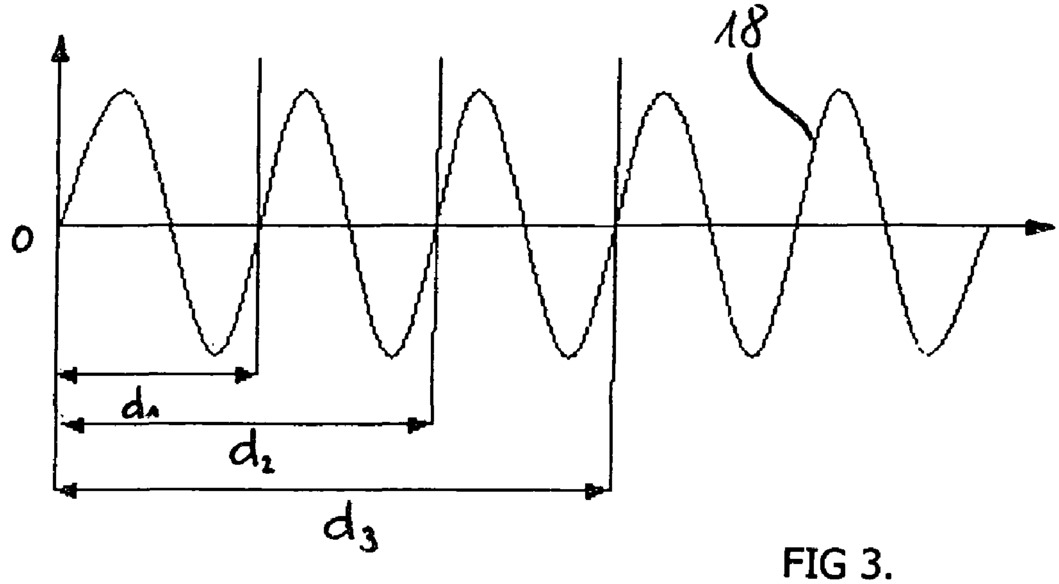
FIG. 3 shows a signal time chart for illustrating measures used for processing according to one embodiment of the present invention.

FIG. 3 shows how higher order zero crossing distances are calculated from a band-pass signal 18. The first order zero crossing distance between two consecutive zero crossings is denominated $d_1$. For example, only the rising zero crossings are taken into account. The second order zero crossing is calculated between three zero crossings and denominated $d_2$. The third order zero crossing is calculated between four zero crossings and denominated $d_3$ and so forth up to the order n.

Figure 4:
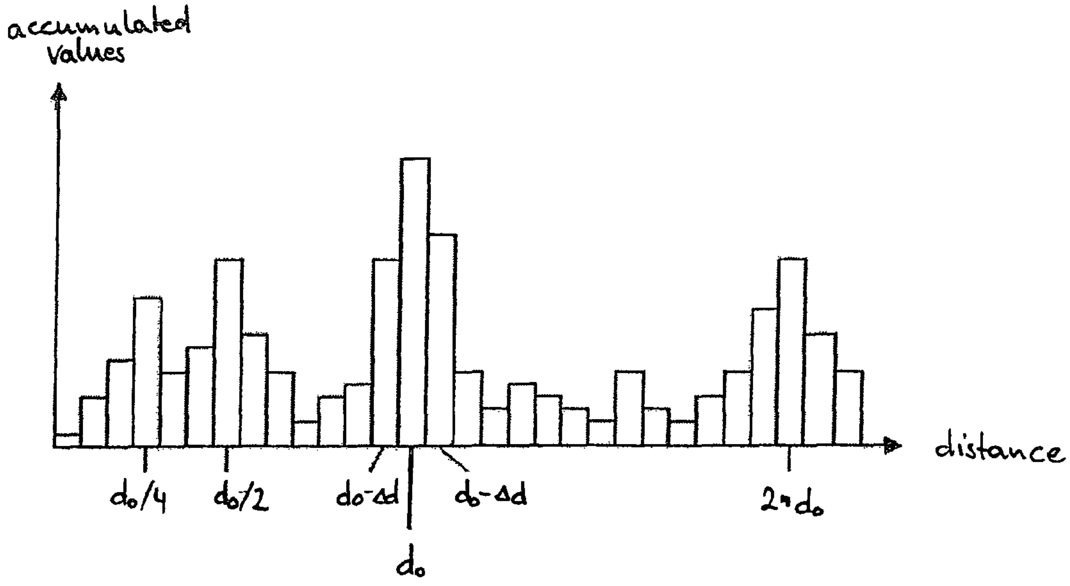
FIG. 4 shows a result of the calculation of the time-distance histogram for a given instant in time, according to one embodiment of the present invention.

FIG. 4 shows an example for the result of the calculation of the time-distance histogram for a given instant in time. The occurrence of the different distance values is plotted. When $d_0$ is the zero crossing distance of the fundamental frequency, this distance value occurs the most often. Neighboring values can also appear more often due to measurement errors. Moreover, multiples and integer fractions of the actual distance value can also appear often due to the measurement method.

Figure 5:
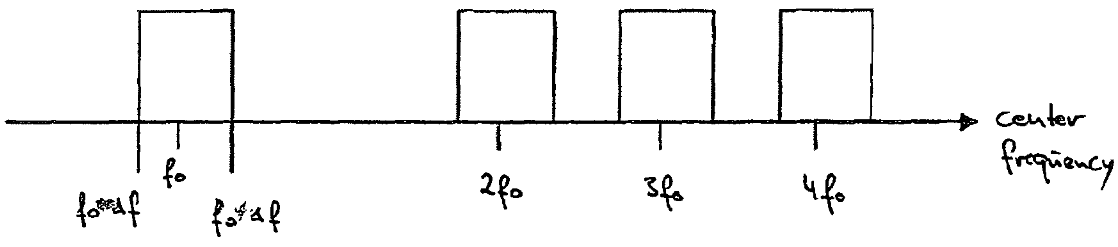
FIG. 5 illustrates the use of band pass signals with center frequencies in a harmonic relation or close to a harmonic relation to calculate a time-distance histogram, according to one embodiment of the present invention.

FIG. 5 shows how band-pass signals whose center frequencies are in a harmonic relation or close to a harmonic relation are used to calculate the time-distance histogram. Let $f_0$ be the fundamental frequency hypothesis and $f_c$ the center frequency of the band-pass filter. According to one embodiment of the present invention, only band-pass signals with center frequencies in a range $f_0-\Delta_0 f<f_c<f_0+\Delta_0 f$, $2*f_0-\Delta_1 f<f_c<2*f_0+\Delta_1 f$, $n*f_0-\Delta_n f<f_c<n*f_0+\Delta_n f$ are used for the calculation of the time-distance histogram. In one embodiment, all possible fundamental frequency hypotheses are processed.

The present invention may be embodied in various forms and should not be construed as limited to the embodiments set forth herein. Rather, these embodiments are provided so that disclosure will fully convey the invention to those skilled in the art. While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without department from the spirit and scope of the invention as it is defined in the appended claims.

What is claimed is:

1. A non-transitory computer readable medium comprising computer executable code which when executed by a computer performs the steps of:

receiving a harmonic signal representing sound from multiple sound sources;

splitting the harmonic signal representing sound from multiple sound sources into a plurality of frequency channels;

determining, for each frequency channel in the plurality of frequency channels, distance between crossings of different orders including higher order crossings;

entering the distance crossing at all values between a current crossing and a precious crossing;

storing the distance in a three-dimensional representation together with a related time and frequency; and calculating a histogram of the determined distances from the three-dimensional representation of different channels for every instant in time, indicating how often a certain distance value is identified; and determining the fundamental frequency by identifying a maximum peak in the histogram and the distance associated with the maximum peak and multiplying the associated distance with a sampling rate.

2. A computer program product embodied on a non-transitory computer readable medium when executed performs the steps:

receiving the harmonic signal representing the sound from multiple sound sources;

splitting the harmonic signal representing sound from multiple sound sources into a plurality of frequency channels;

determining, for each frequency channel in the plurality of frequency channels, distance between crossings of different orders including higher order crossings;

entering the distance between crossing at all values between a current crossing and a previous crossing;

storing the distances in a three-dimensional representation together with a related time and frequency;

calculating a histogram of the determined distances from the three-dimensional representation of different channels for every instant in time, indicating how often a certain distance value is identified; and determining the fundamental frequency by identifying a maximum peak in the histogram and the distance associated with the maximum peak and multiplying the associated distance with a sampling rate.

3. The computer program product of claim 2, wherein the crossings comprise one of:

a maxima;

a minima; and a constant.

4. The computer program product of claim 2, wherein a band pass signal where center frequencies of band passes are in a harmonic relation or close to a harmonic relation is used to calculate the histogram.

5. The computer program product of claim 2, wherein an entry of the histogram is weighted with energy of an underlying band pass signal to make a distance of the fundamental frequency more discernable.

6. The computer program product of claim 2, wherein independent weights are used for a plurality of crossings of different orders in calculating the histogram.

7. The computer program product of claim 2, wherein determined distances resulting from unresolved harmonics are integrated in the histogram.

8. The computer program product of claim 2, further comprising evaluating an evidence value for a band pass signal to originate from the fundamental frequency for the instant in time, wherein a minimum distance between a crossing distance corresponding to the fundamental frequency and those corresponding to the band pass signal is used as the evidence value.

9. The computer program product of claim 2, further comprising suppressing peaks at multiples and integer fractions of a distance corresponding to the fundamental frequency, wherein a maximum value corresponding to the fundamental frequency at the instant in time is used to suppress the peaks at the multiples and the integer fractions at the instant in time.

10. The computer program product of claim 2, wherein the method is applied for separation of acoustic sound sources in monaural recordings.

11. The computer program product of claim 2, wherein said higher order crossings include at least one of a second, third, fourth, fifth or sixth order crossings.

12. The computer program product of claim 2, wherein said step of calculating a histogram further comprises the step of using only filter channels having center frequencies that have a substantially harmonic relationship with each other.

13. The computer program product of claim 2, further comprising the step of combining the distances of the plurality of frequency channels by determining the distances between the current zero-crossing and at least two previous zero-crossings.

14. The computer program product of claim 2, wherein said step of calculating a histogram further comprises the step of using only filter channels having center frequencies that have a substantially harmonic relationship with each other.

15. The computer program product of claim 2, further comprising the step of combining the distances of the plurality of frequency channels by determining the distances between the current zero-crossing and at least two previous zero-crossings.

16. The computer program product of claim 2, further comprising the step, prior to the storing step, of calculating a difference between the current crossing and the previous crossing.

* * * * *

UNITED STATES PATENT AND TRADEMARK OFFICE

CERTIFICATE OF CORRECTION

PATENT NO. : 8,108,164 B2
APPLICATION NO. : 11/340918
DATED : January 31, 2012
INVENTOR(S) : Frank Joublin and Martin Heckmann It is certified that error appears in the above-identified patent and that said Letters Patent is hereby corrected as shown below:

Column 6, line 30 claim 1, delete “distance crossing” and insert --distances between crossings--.

Column 6, line 31 claim 1, delete “precious” and insert --previous--.

Column 6, line 51 claim 2, delete “distance” and insert --distances--.

Column 6, line 53 claim 2, delete “distance between crossing” and insert --distances between crossings--.

Signed and Sealed this
Tenth Day of April, 2012

David J. Kappos
*Director of the United States Patent and Trademark Office*